(12) United States Patent
Mayr

(10) Patent No.: US 8,925,608 B2
(45) Date of Patent: Jan. 6, 2015

(54) BONDING HEAD WITH A HEATABLE AND COOLABLE SUCTION MEMBER

(71) Applicant: Besi Switzerland AG, Cham (CH)

(72) Inventor: Andreas Mayr, Wiesing (AT)

(73) Assignee: Besi Switzerland AG, Cham (CH)

( * ) Notice: Subject to any disclaimer, the term of this patent is extended or adjusted under 35 U.S.C. 154(b) by 0 days.

(21) Appl. No.: 14/158,747

(22) Filed: Jan. 17, 2014

(65) Prior Publication Data
US 2014/0202636 A1    Jul. 24, 2014

(30) Foreign Application Priority Data
Jan. 21, 2013    (CH) .......................................... 245/13

(51) Int. Cl.
*B32B 37/00*    (2006.01)
*H01L 21/67*    (2006.01)
*B29C 65/00*    (2006.01)
*B30B 15/06*    (2006.01)
*B30B 15/34*    (2006.01)

(52) U.S. Cl.
CPC ...... *H01L 21/67103* (2013.01); *B29C 66/9121* (2013.01); *B30B 15/064* (2013.01); *B30B 15/34* (2013.01)
USPC ........... 156/359; 156/378; 156/498; 156/581; 156/583.1

(58) Field of Classification Search
USPC ............... 156/359, 378, 498, 580, 581, 583.1
See application file for complete search history.

(56) References Cited

U.S. PATENT DOCUMENTS

| 6,217,705 | B1 * | 4/2001  | Tamura et al.    | 156/345.53 |
| 6,221,201 | B1 * | 4/2001  | Tamura et al.    | 156/345.53 |
| 6,821,381 | B1   | 11/2004 | Yamauchi et al.  |            |
| 6,899,789 | B2 * | 5/2005  | Tamura et al.    | 156/345.53 |
| 7,793,698 | B2 * | 9/2010  | Hirata           | 156/498    |
| 8,075,729 | B2 * | 12/2011 | Holland et al.   | 156/345.27 |

FOREIGN PATENT DOCUMENTS

| JP | 10-209228      | 8/1998  |
| JP | 2000-12630     | 1/2000  |
| JP | 2004-63947     | 2/2004  |
| JP | 2007-311679    | 11/2007 |
| KR | 10-2011-0006563| 1/2011  |
| WO | 2012/002300    | 1/2012  |

\* cited by examiner

*Primary Examiner* — James Sells
(74) *Attorney, Agent, or Firm* — Nixon Peabody LLP

(57) ABSTRACT

A bonding head for mounting semiconductor chips on a substrate comprises a bonding head body and a suction member formed of a single piece. The elements necessary for heating, cooling and monitoring the temperature of the suction member are all integrated into the suction member, so that neither the heating nor the cooling elements are separated from the semiconductor chip by a surface preventing the heat transfer. The bonding head body contains only the elements necessary for supplying the suction member with electrical power and with the cooling medium.

12 Claims, 2 Drawing Sheets

BONDING HEAD WITH A HEATABLE AND COOLABLE SUCTION MEMBER

PRIORITY CLAIM

Applicant hereby claims foreign priority under 35 U.S.C §119 from Swiss Patent Application No. 245/13 filed Jan. 21, 2013, the disclosure of which is herein incorporated by reference.

FIELD OF THE INVENTION

The invention concerns a bondhead with a heatable and coolable suction member.

BACKGROUND OF THE INVENTION

Such a bonding head is used in the semiconductor industry for normal bonding or thermocompression bonding (TC bonding) of a semiconductor chip (known as a die) on a substrate. The formation of the connection occurs under action of temperature and optional pressure.

Certain bonding processes such as TC bonding require the heating and cooling of the semiconductor chip during bonding on the substrate, i.e. the driving of temperature profiles with extreme heating and cooling rates. This heating and cooling requires time and substantially determines the cycle time and therefore the throughput of the machine.

From U.S. Pat. No. 6,821,381 a thermocompression bonding head is known which comprises a suction member made of ceramics that is screwed onto the bonding head. The suction member contains a resistance heating which is attached in a recess of the suction member. A thermoelement is additionally arranged outside on the suction member. The upper side of the suction member contains recesses, so that cooling channels are formed between the bonding head and the suction member, which cooling channels can be supplied with compressed air for cooling the suction member. The compressed air flows in the horizontal direction through the cooling channels and reaches the ambient environment at their end.

From WO 2012002300 a thermocompression bonding head is known which comprises a bonding head body with an integrated heater and a cooling channel which can be supplied with compressed air, and a suction member which can be held by means of vacuum on the bonding head body. The suction member also comprises a cooling channel which can be supplied with compressed air.

With such bonding heads known from the state of the art it is possible to heat up the semiconductor chip with a heating rate of 100° C./s and to cool the same with a cooling rate of 50° C./s.

SUMMARY OF THE INVENTION

The invention is based on the object of improving such a bonding head, i.e. especially increasing the heating rate and the cooling rate of suction member.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 schematically shows a sectional view of a bonding head in accordance with the invention;

DETAILED DESCRIPTION OF THE INVENTION

Figure 1:
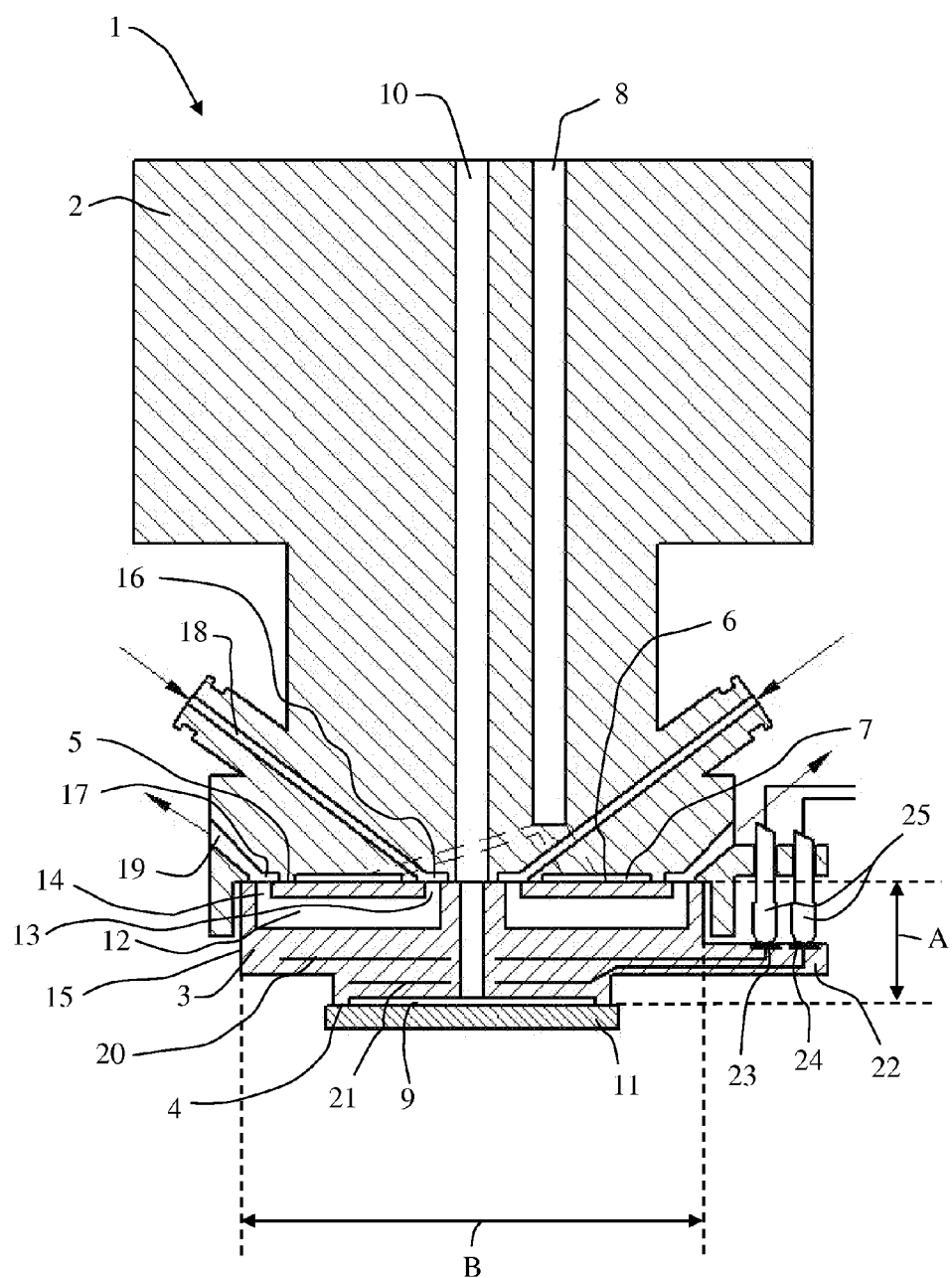

A semiconductor mounting apparatus comprises a pick-and-place system which picks up one semiconductor chip after the other and places them on a substrate. The pick-and-place system comprises a bonding head 1. FIG. 1 schematically shows the parts of the bonding head 1 which are necessary for understanding the invention. The bonding head 1 is displaceably mounted on the pick-and-place system in a direction extending perpendicularly to the surface of a substrate, which direction is usually the vertical direction and is designated here as the Z direction. The bonding head 1 comprises a bonding head body 2 and a heatable and coolable suction member 3 which is detachably fixed to the bonding head body 2.

The suction member 3 has a bottom side 4 and an upper side 5 which are opposite of each other and extend in parallel with respect to each other. The bonding head body 2 has a bottom side 6 on which the upper side 5 the suction member 3 rests. The bottom side 6 of the bonding head body 2 or the upper side 5 of the suction member 3 is provided with one or more first recesses 7, into which opens a first channel 8 or several first channels 8, which channels can be supplied with a vacuum in order to suck up and tightly hold the suction member 3 resting on the bottom side 6.

Figure 2:
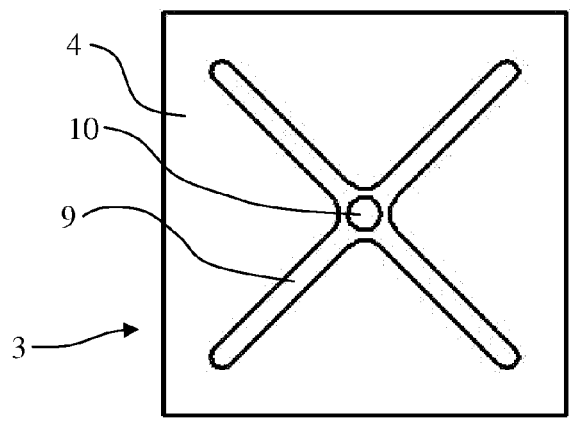
FIG. 2 shows a bottom side of a suction member.

FIG. 2 shows the bottom side 4 of the suction member 1. The bottom side 4 comprises one (as shown) or more recesses 9. The bonding head body 2 and the suction member 3 contain at least one second channel 10, which opens into the said one or more recesses 9 and can be supplied with vacuum for sucking up the semiconductor chip 11. The surface area of the bottom side 4 which is covered entirely by the recess or recesses 9 forms a suction area for sucking up the semiconductor chip 11, while the surface area of the bottom side 4 which is not covered by the recess or recesses 9 allows the transfer of the heat during heating or dissipation of the heat during cooling of the semiconductor chip 11. These two proportions of the surface area are to be determined in respect of their ratio in such a way that the semiconductor chip 11 can be sucked up with the necessary force on the one hand and can be heated and cooled efficiently on the other hand.

The suction member 3 contains one or more cooling channels 12 which respectively comprise an inlet 13 and an outlet 14, which open into a side wall 15 or preferably into the upper side 5 of the suction member 3. The bottom side 6 of the bonding head body 2 is formed with one or more second recesses 16 and with one or more third recesses 17. The bonding head body 2 contains a third channel or several third channels 18, which opens or open into the said one or more second recesses 16, and a fourth channel or several fourth channels 19, which opens or open into the said one or more third recesses 17. When the suction member 3 rests on the bottom side 6 of the bonding head body 2, the said one or more recesses 16 form one or more cavities which connect the inlets 13 of the cooling channels 12, and the said one or more recesses 17 form one or more cavities which connect the outlets 14 of the cooling channels 12. The suction member 3 can therefore be cooled by supplying a cooling medium through the third channel 18 or the third channels 18 and by discharging the cooling medium through the fourth channel 19 or the fourth channels 19. The cooling medium is compressed air for example which is supplied to the third channel 18 or the third channels 18, whereupon it flows through the cooling channels 12 and is discharged via the fourth channel or the fourth channels to the ambient environment. The third channel 18 or the third channels 18 and the fourth channel 19 or the fourth channels 19 can also be part of a closed cooling circuit in which a gaseous or liquid cooling medium can be circulated.

The suction member 3 further contains an electrical resistance heating 20 and a temperature sensor 21 which are integrated in the suction member 3. The temperature sensor 21 is preferably a temperature-dependent electrical resistor and is used to measure the current temperature of the suction member 3. The suction member 3 contains for example a laterally protruding projection 22 as shown here, whose upper side is situated lower than the upper side 5 of the suction member 3 and whose bottom side is situated higher than the bottom side 4 of the suction member 3. The upper side of the projection 22 contains two first electrical contact areas 23 which are connected to the electrical resistance heating 20 and two second electrical contact areas 24 which are connected to the temperature-dependent electrical resistor which forms the temperature sensor 21. The electrical contact areas can also be integrated in the upper side 5 and/or the side walls 15 of the suction member 3.

Figure 3:
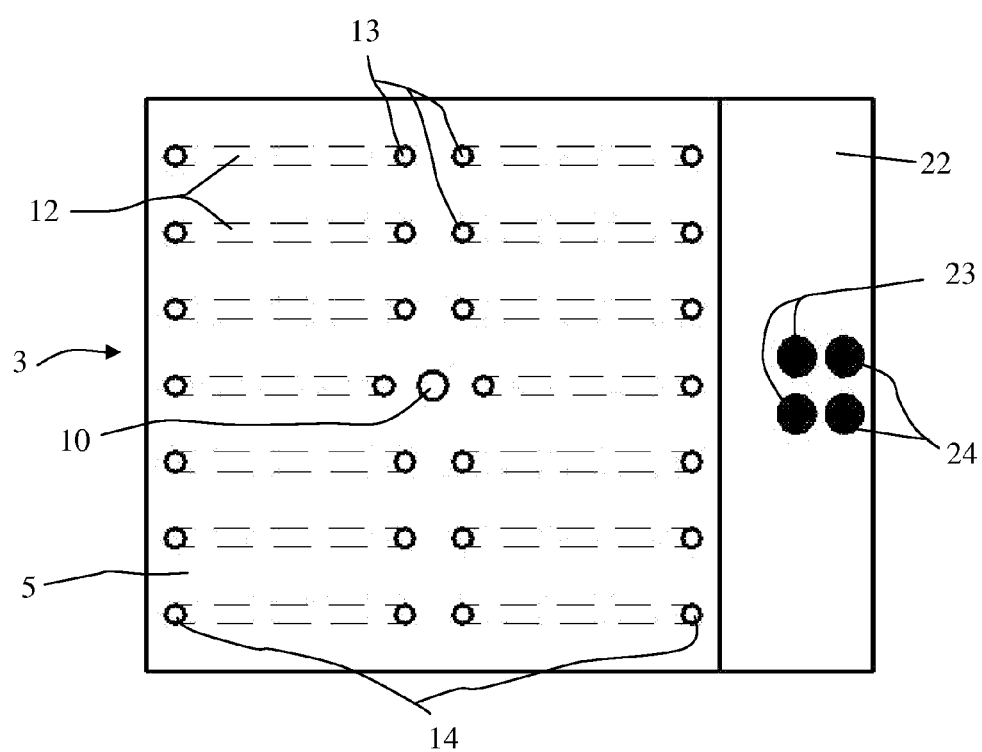
FIG. 3 shows an upper side of the suction member.

FIG. 3 shows the suction member 3 in a top view. The drawing shows the upper side 5 with the inlets 13 and the outlets 14 of the cooling channels 12, and the first and second electrical contact areas 23 and 24.

Electrical contact elements 25 such as contact pins (as shown) or brackets and the like are attached to the bonding head body 2, which contact elements are preferably mounted in a resilient way and are electrically connected to a control unit which supplies the current required for the operation of the resistance heating and for the operation of the temperature sensor 21. When the suction member 3 is sucked up to the bottom side 6 of the bonding head body 2, the electrical contact elements 25 come into contact with the contact areas 23 and 24, so that the electrical connections to the electrical resistance heating 20 and to the temperature sensor 21 are produced.

The cooling channels 12 are preferably arranged directly beneath the upper side 5 of the suction member 3. The electrical resistance heating 20 is preferably arranged beneath the cooling channels 12, but can also be arranged above the cooling channels 12, i.e. between the cooling channels 12 and the upper side 5. The temperature sensor 21 is preferably arranged directly above the bottom side 4 of the suction member 3, but can also be positioned at another location in the suction member 3. The suction member 3 consists of a single piece of sintered ceramic material. The production occurs for example in such a way that several layers of ceramic material, the resistance heating 20 and the temperature sensor 21 are stacked in the desired sequence above each other and are then sintered together so that one single ceramic element is produced which forms the suction member 3.

The bonding head 1 in accordance with the invention is characterized in that the elements required for the heating, cooling and monitoring of the temperature of the suction member 3 are all integrated in the suction member 3 and the bonding head body 2 only comprises the elements necessary for supplying the suction member 3 with electrical power and with the cooling medium. Furthermore, the arrangement and configuration of the said elements is made on the other hand in such a way that the suction member 3 is flat, i.e. the distance A between the bottom side 4 and the upper side 5 is clearly smaller than the maximum width B, i.e. the maximum distance between mutually opposite side walls 15 (without considering the projection 22). The compact arrangement of the suction member 3 of a single piece of sintered ceramic material with integrated electrical resistance heating 20 and integrated temperature sensor 21 leads to a very low thermal mass of the suction member 3 on the one hand, and neither the heating nor the cooling are separated from the semiconductor chip 11 by a surface preventing the heat transfer on the other hand, which would be the case if the resistance heating 20 and/or the cooling channels 12 were integrated in the bonding head body 2.

The cooling channels 12 are preferably arranged in only one single plane which extends parallel to the upper surface 5 of the suction member 3 and not in several planes situated one above the other. The cooling channels 12 only form a low height in this configuration, so that the flat structure of the suction member 3 is obtained. Flat structure means low overall height.

In the case of an embodiment provided for cooling with compressed air or an inert gas, the fourth channel or the fourth channels 19 preferably extend as illustrated in a direction extending obliquely with respect to the bottom side 4 of the suction member 3 and open into the ambient environment. The outlet opening of the fourth channel or fourth channels 19 is therefore further remote from the bottom side 4 of the suction member 3 than the inlet opening of the fourth channel or fourth channels 19. The emitted compressed air therefore flows off in the upward direction, thus reducing the likelihood that the emitted compressed air displaces or blows away already mounted semiconductor chips whose connections to the substrate have not yet entirely solidified, or produces drifting in the adhesive material in the case of adjacent substrate places which have been coated with an adhesive material but have not yet been placed with a semiconductor chip.

Since the suction member 3 is detachably fixed to the bonding head body 2 or is held by means of a vacuum on the bonding head body 2, it can be exchanged easily and automatically in order to adjust the semiconductor mounting device to semiconductor chips of different size.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. A bonding head, comprising
  a bonding head body, and
  a flat suction member consisting of a single piece of sintered ceramic material and having a bottom side and an upper side which are opposite of each other,
  wherein in the suction member:
  the bottom side is formed with at least one recess,
  one or more cooling channels are provided beneath the upper side, which cooling channels comprise an inlet and an outlet,
  an electrical resistance heating is arranged beneath or above the cooling channels, and
  a temperature sensor is integrated, wherein the electrical resistance heating is connected to first contact areas and the temperature sensor to second contact areas;
  wherein the bottom side of the bonding head body or the upper side of the suction member comprises one or more recesses, and wherein the bonding head body comprises one or more first channels which opens or open into the one or more recesses and can be supplied with vacuum for sucking up the suction member;

wherein the bonding head body and the suction member comprise at least one second channel which opens into the at least one recess in the bottom side of the suction member and can be supplied with vacuum for sucking up the semiconductor chip;

wherein the bonding head body comprises one or more third channels which is or are in communicating connection with the inlets of the cooling channels, and one or more fourth channels which is or are in communicating connection with the outlets of the cooling channels; and wherein contact elements are attached to the bonding head body, which come into contact with the first contact areas or the second contact areas when the suction member is sucked up, so that the suction member can be heated by the electrical resistance heating, can be cooled by supplying a cooling medium through the third channel or channels and discharging the cooling medium through the fourth channel or channels, and so that the temperature measured by the temperature sensor can be transmitted to a control unit.

2. The bonding head of claim 1, wherein the fourth channel or channels extends or extend in a direction arranged obliquely with respect to the bottom side of the suction member and open into the ambient environment, so that an outlet opening of the fourth channel or channels is or are further remote from the bottom side of the suction member than the inlet opening of the fourth channel or channels.

3. The bonding head of claim 1, wherein the cooling channels, the third channel or channels and the fourth channel or channels belong to a closed circuit.

4. The bonding head of claim 1, wherein the cooling channels are arranged in a single plane extending parallel to the upper side of the suction member.

5. The bonding head of claim 2, wherein the cooling channels are arranged in a single plane extending parallel to the upper side of the suction member.

6. The bonding head of claim 3, wherein the cooling channels are arranged in a single plane extending parallel to the upper side of the suction member.

7. The bonding head of claim 1, wherein the contact elements are resiliently mounted on the bonding head body.

8. The bonding head of claim 2, wherein the contact elements are resiliently mounted on the bonding head body.

9. The bonding head of claim 3, wherein the contact elements are resiliently mounted on the bonding head body.

10. The bonding head of claim 4, wherein the contact elements are resiliently mounted on the bonding head body.

11. The bonding head of claim 5, wherein the contact elements are resiliently mounted on the bonding head body.

12. The bonding head of claim 6, wherein the contact elements are resiliently mounted on the bonding head body.

* * * * *